United States Patent [19]

Nutz

[11] 4,258,277
[45] Mar. 24, 1981

[54] DISCRIMINATOR CIRCUITS

[75] Inventor: Karl-Diether Nutz, Oedheim, Fed. Rep. of Germany

[73] Assignee: Licentia Patent-Verwaltungs-G.m.b.H., Frankfurt am Main, Fed. Rep. of Germany

[21] Appl. No.: 24,078

[22] Filed: Mar. 26, 1979

[30] Foreign Application Priority Data

Mar. 25, 1978 [DE] Fed. Rep. of Germany ....... 2813073

[51] Int. Cl.³ .......................... H03K 5/153; H03L 5/00
[52] U.S. Cl. .................................... 307/350; 307/358; 307/363; 307/567
[58] Field of Search ............... 307/237, 350, 362, 363, 307/358, 318; 328/146, 147, 149, 150, 171

[56] References Cited

U.S. PATENT DOCUMENTS

| | | | |
|---|---|---|---|
| 3,523,198 | 8/1970 | Keller | 307/318 X |
| 3,988,644 | 10/1976 | Krone | 307/358 X |
| 4,013,902 | 3/1977 | Payne | 307/363 X |

FOREIGN PATENT DOCUMENTS

| | | |
|---|---|---|
| 2321662 | 11/1974 | Fed. Rep. of Germany. |
| 2345215 | 4/1975 | Fed. Rep. of Germany. |
| 553495 | 8/1974 | Switzerland. |

*Primary Examiner*—John Zazworsky
*Attorney, Agent, or Firm*—Spencer & Kaye

[57] ABSTRACT

A discriminator circuit is arranged to emit a defined output signal when a certain value of a variable direct supply voltage is reached. The discriminator circuit comprises a current mirror circuit in the form of a first transistor connected to the supply voltage source and arranged to divide an input current into two current branches by means of two collector electrodes. One current branch comprises a Zener diode and a first resistor and this branch is connected to a limiter circuit for limiting the rise in the supply voltage to a predetermined maximum value and the other current branch comprises a second resistor and a second transistor for emitting an output signal from the discriminator circuit.

5 Claims, 1 Drawing Figure

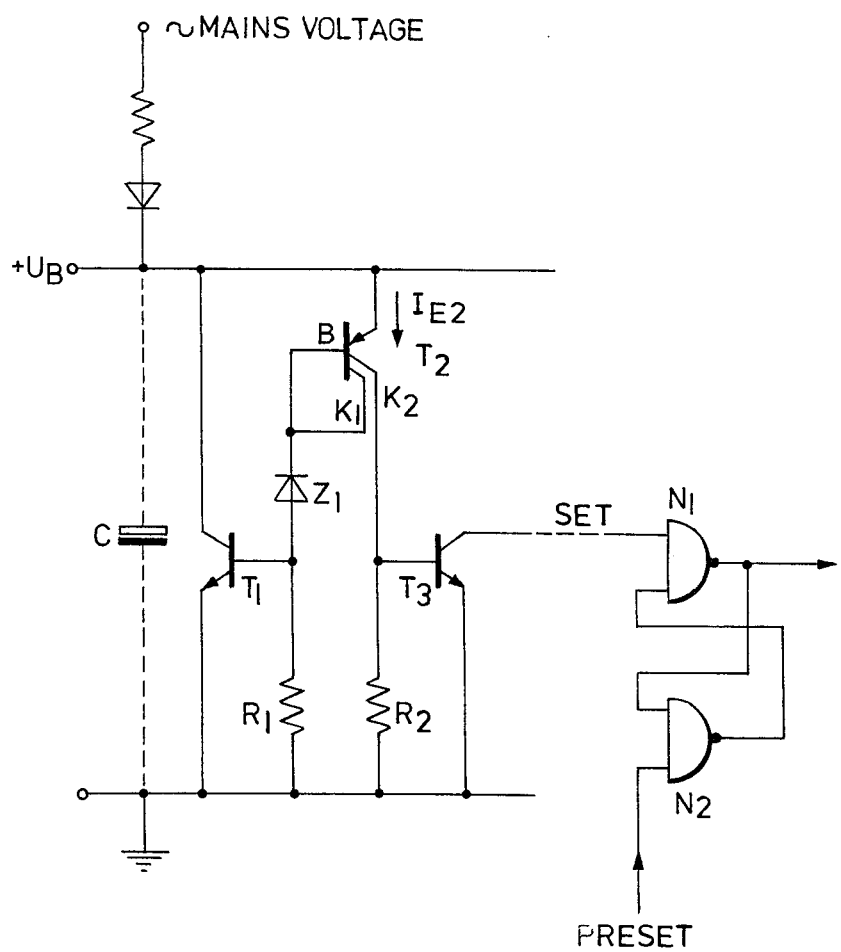

DISCRIMINATOR CIRCUITS

BACKGROUND OF THE INVENTION

The invention relates to a discriminator circuit which emits a defined output signal when a certain value of a variable direct supply voltage is reached. The variable direct voltage occurs for example at a charging capacitor which is charged by means of rectified mains voltage. When connecting the mains voltage, the capacitor is charged up and a discriminator circuit connected thereafter must ensure that storage circuits for receiving information which are arranged thereafter are released by the emission of a control pulse when a certain voltage is reached at the charge capacitor. These discriminator circuits are used for example in digital light dimmer switches, in which, in the case of mains failure and recovery of the voltage, a defined output condition is set by means of another circuit not described in greater detail, and, once a certain direct voltage value is reached, new information can be entered in the memory store of the light dimmer circuit.

SUMMARY OF THE INVENTION

The object of the invention is to provide a discriminator circuit with the aid of which both the direct supply voltage can be limited to a certain voltage value and a defined output signal can be produced. A further object of the invention is to provide a discriminator circuit which can operate very accurately with as few components as possible. These objects are met in accordance with the invention by the fact that a current mirror circuit is connected to the supply voltage source and is arranged to divide an input current into two current branches, a limiter circuit is arranged in one current branch to limit rise in the supply voltage to a predetermined maximum value and a switching element is arranged in the other current branch emitting an output signal from said discriminator signal.

By using the current mirror circuit it is possible to set the point in time for intervention by the limiter circuit independently of the emission of the output signal when a certain voltage value is reached. Furthermore, the circuit in accordance with the invention has the advantage that deflection resistors and limiting resistors can be economised in the case of a branch collector transistor forming the current mirror circuit.

If the current mirror circuit comprises a first transistor having two collector electrodes, one current branch can be connected to one of the collector electrodes, said branch comprising a Zener diode and a first resistor connected in series, and the other current branch can be connected to the other collector electrode, said other current branch comprising a second resistor and a second transistor. The said one collector electrode is desirably also connected to the base electrode of the said first transistor.

The Zener diode and the first resistor determine the voltage value at which a transistor connected thereto prevents a further rise in voltage of the direct supply voltage. For this reason, the connection between the Zener diode and the first resistor is connected to the base electrode of a limiter transistor connected between the poles of the supply voltage source.

In the case of an advantageous embodiment of the circuit in accordance with the invention the input current is subdivided by the current mirror circuit preferably into equal parts over the two collector current branches. The resistors are dimensioned so that the use of the limiter and emission of the output signal take place at the same time. This means that both collector electrodes of the current mirror transistor are of equal size and that the resistors in the two current branches also have preferably equal values.

BRIEF DESCRIPTION OF THE DRAWING

The invention and its further advantageous refinement will be described in greater detail in the following, by way of example, with reference to the drawing which is a circuit diagram of one embodiment of a discriminator circuit in accordance with the invention.

DESCRIPTION OF PREFERRED EMBODIMENT

Referring to the drawing, mains voltage is used for charging up a charging capacitor C via a resistor $R_3$ and a rectifier $D_1$, the direct supply voltage UB dropping across this charging capacitor C. When connecting the mains voltage to the circuit shown the capacitor is charged up initially until the direct voltage present at the charging capacitor is limited by a transistor $T_1$ the collector emitter path of which is connected in parallel with the capacitor C. A current mirror circuit is formed by a transistor $T_2$ which transistor has two collector electrodes $K_1$, $K_2$. One collector electrode $K_1$ is short-circuited by the base electrode of the transistor $T_2$ and is connected to the series connection of a Zener diode $Z_1$ and a resistor $R_1$. The resistor $R_2$ is connected to the other collector electrode $K_2$ and the base-emitter path of a switching transistor $T_3$ is connected in parallel with the said resistor $R_2$. The output signal is tapped at the collector of the switching transistor $T_3$.

The connection between the Zener diode $Z_1$ and the resistor $R_1$ is connected to the base-electrode of the limiter transistor $T_1$. The circuit comprising the current mirror transistor $T_2$ and the two collector current branches is also connected to the two poles of the direct supply voltage source $U_B$.

As the charge voltage at the capacitor C rises the transistor $T_3$ initially remains blocked until the collector current $I_{min}$ exceeds the value $U_{BET3}/R_2$ via the current branch $K_2$, where $U_{BET3}$ is the base-emitter voltage of the transistor $T_3$. The same current then flows through the Zener diode $Z_1$ and the resistor $R_1$ via the collector electrode $K_1$ based on the symmetry of the current mirror transistor $T_2$. The sum of the two collector currents corresponds to the input current $I_{E2}$ which input current flows into the discriminator circuit when the limiter transistor $T_1$ is blocked initially as the sole current derived from the direct supply voltage source. If the voltage $U_B$ at the capacitor C has reached the value $U_B = U_{Z1} + U_{BET_1} + U_{BET_2}$ then the transistor $T_1$ is triggered, the latter now limiting the supply voltage to this value $U_B$.

By selecting the resistors $R_1$, $R_2$, the point in time when the limiter circuit becomes operative and the point in time when a pulse is emitted at the transistor $T_3$ can be set independently of each other depending on the direct supply voltage. Thus, it would be possible to connect the transistor $T_3$ at a direct voltage value which is smaller than the maximum voltage value at the capacitor C determined by the intervention point of the limiter circuit. However, it is preferred to allow the point in time of emitting a pulse and the point in time of using the limiter circuit to coincide and this occurs by making the resistors $R_1$, $R_2$ of equal size and also by selecting the collector electrodes $K_1$ and $K_2$ of the transistor $T_2$ to have the same dimensions so that equal currents flow through the two current branches because of the symmetry of the transistor.

The embodiment of transistor $T_2$ as a current mirror makes it possible to use only two resistors. If transistor $T_2$ were to be a simple transistor a deflection resistor would have to be connected between the base and emitter electrode of the transistor $T_2$ and the operating point of the Zener diode $Z_1$ would be defined by the said deflection resistor. Moreover, a limiting resistor would have to be connected into the collector current branch in order to limit the collector current, which would be dependent on the current intensification factor of the transistor, to a permissible value.

In the arrangement illustrated in the drawing, an intermediate memory store consisting of two NAND-gates $N_1$ and $N_2$ is connected after the output of the transistor $T_3$. These two NAND-gates $N_1$ and $N_2$ are cross-coupled and the output signal of the transistor $T_3$ is passed to the NAND-gate $N_1$ as a "SET" signal, while the "PRESET" signal is passed to the free input of the NAND-gate $N_2$. Only if the transistor $T_3$ is connected is the "SET" signal a logic "0" and the intermediate memory store emits a logic "1" as the output signal. Previously, the "PRESET" signal was operated from a logic "0" at the beginning of the connection phase to "1" so that the preset condition of the intermediate memory store is "0".

When the transistor $T_3$ is connected, the "SET" signal is thus a logic "0" and the intermediate memory store emits a logic "1" which releases the logic unit or memory store for the purpose of receiving new information.

In the embodiment shown in the drawing, the transistors $T_1$ and $T_3$ are NPN transistors for example while the transistor $T_2$ is a PNP double-collector transistor. The resistors $R_1$, $R_2$ are 14 k$\Omega$ in size, for example.

The direct voltage at which the transistor $T_3$ is switched and at which voltage limitation takes place at the capacitor C, is 8.7 volts by way of example.

The invention is not restricted to the above described embodiments and modifications are envisaged without departing from the spirit and scope of this invention as defined by the appended claims.

I claim:

1. A discriminator circuit arranged to emit a defined output signal when a certain value of a variable direct supply voltage is reached, said discriminator circuit comprising a current mirror circuit connected to the supply voltage source and arranged to divide an input current into two current branches, a limiter circuit arranged in one current branch to limit rise in the supply voltage to a predetermined maximum value and a switching element arranged in the other current branch for emitting an output signal from said discriminator circuit.

2. A discriminator circuit as claimed in claim 1, in which the current mirror circuit comprises a first transistor having two collector electrodes, said one branch being connected to one said collector electrode and comprising a Zener diode and a first resistor connected in series and said other branch being connected to said other collector electrode and comprising a second resistor and a second transistor.

3. A discriminator circuit as claimed in claim 2, in which the said one collector electrode is also connected to the base electrode of said first transistor.

4. A discriminator circuit as claimed in claim 2, in which the connection between the Zener diode and the first resistor is connected to the base electrode of a limiter transistor connected between the poles of the supply voltage source.

5. A discriminator circuit as claimed in claim 4, in which the input current is subdivided by the current mirror circuit into equal parts over the two collector current branches, said first and second resistors being so dimensioned that intervention by the limiter transistor and emission of the output signal take place at the same time.

* * * * *